(12) United States Patent
Lim

(10) Patent No.: US 7,919,370 B2
(45) Date of Patent: Apr. 5, 2011

(54) FLASH DEVICE AND THE MANUFACTURING METHOD

(75) Inventor: Hyun Ju Lim, Mapo-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 595 days.

(21) Appl. No.: 11/929,900

(22) Filed: Oct. 30, 2007

(65) Prior Publication Data
US 2008/0157177 A1 Jul. 3, 2008

(30) Foreign Application Priority Data
Dec. 28, 2006 (KR) .................. 10-2006-0135884

(51) Int. Cl.
*H01L 21/336* (2006.01)

(52) U.S. Cl. ............... 438/257; 257/314; 257/E21.209; 257/21.679; 438/593

(58) Field of Classification Search .............. 257/314, 257/E21.209, E21.422, E21.679, E21.681, 257/E29.129; 438/257, 258, 593
See application file for complete search history.

(56) References Cited

U.S. PATENT DOCUMENTS
5,342,801 A * 8/1994 Perry et al. .................. 438/588
2007/0007578 A1* 1/2007 Li et al. ........................ 257/315

FOREIGN PATENT DOCUMENTS
KR 10-2000-0068363 6/2001
* cited by examiner

*Primary Examiner* — David Vu
(74) *Attorney, Agent, or Firm* — Saliwanchik, Lloyd & Eisenschenk

(57) ABSTRACT

A flash device and a manufacturing method thereof are provided. An ONO pattern can be formed on a floating gate, and a control gate can be formed on the ONO pattern. The ONO pattern can be formed with a portion that projects farther out than the sides of the floating gate and the control gate.

10 Claims, 4 Drawing Sheets

FLASH DEVICE AND THE MANUFACTURING METHOD

CROSS-REFERENCE TO RELATED APPLICATION

The present application claims the benefit under 35 U.S.C. §119 of Korean Patent Application No. 10-2006-0135884, filed Dec. 28, 2006, which is hereby incorporated by reference in its entirety.

BACKGROUND

FIGS. 1 to 4 are cross-sectional views showing a related art stack-type flash device formed using a hard mask according to a related art.

Referring to FIG. 1, a device isolating pattern (not shown) and a tunnel oxide film 2 is formed on a semiconductor substrate 1. An auxiliary polysilicon pattern 3 to be used as a floating gate is formed on the tunnel oxide film 2.

Next, an oxide-nitride-oxide (ONO) film 4 is formed on the auxiliary polysilicon pattern 3, and a polysilicon layer 5 to be used as a control gate is formed on the ONO film 4.

Then, a hard mask layer 6 made of an oxide film or a nitride film is formed on the polysilicon layer 5.

An argon fluoride (ArF) photoresist pattern 7 is disposed on the hard mask layer 6.

The hard mask layer 6 is typically formed under the lower surface of the ArF photoresist pattern 7 since the ArF photoresist pattern 7 often has a thinner coating thickness than a krypton fluoride (KrF) photoresist pattern. This makes it difficult to form a stack gate thicker than the ArF photoresist pattern 7. Accordingly, the hard mask layer 6 is typically formed under the ArF photoresist pattern 7.

Referring to FIG. 2, the hard mask layer 6 can be patterned using the ArF photoresist pattern 7 as an etch mask to form a hard mask pattern 8 on the polysilicon layer 5 to be used as a control gate.

Next, referring to FIG. 3, the polysilicon layer 5, the ONO film 4, the auxiliary polysilicon pattern 3, and the tunnel oxide film 2 are etched using the hard mask pattern 8 as an etch mask. Accordingly, a flash device 10 comprising a tunnel oxide film pattern 2a, a floating gate 3a, an ONO pattern 4a and a control gate 5a is formed on the semiconductor substrate 1.

Referring to FIG. 4, after forming the flash device using the hard mask pattern 8, the hard mask pattern 8 is removed from the flash device 10.

The hard mask pattern 8 is typically removed by performing a wet etching process, such as a vapor phase chromatography (VPC) process. During the wet etching process, an oxide film pattern and a nitride film pattern in the exposed ONO pattern 3a of the flash device 10 are often damaged (see, e.g. 4b).

In the flash device 10, the ONO pattern 3a is very important in charging and discharging electrons. Thus, if the ONO pattern 3a is damaged, the capacity of the flash device 10 is largely degraded.

Thus, there exists a need in the art for an improved flash device and fabricating method thereof.

BRIEF SUMMARY

Embodiments of the present invention provide a flash device and fabricating method thereof where an oxide-nitride-oxide (ONO) layer can be inhibited from being damaged during fabrication.

In an embodiment, a flash memory device can include a floating gate on a semiconductor substrate, an ONO pattern on the floating gate, and a control gate on the ONO pattern. The ONO pattern can have a portion that projects farther out than the sides of the floating gate and the control gate.

A manufacturing method of a flash device can include: forming an auxiliary floating polysilicon layer on a tunnel oxide film on a semiconductor substrate; forming an ONO film on the auxiliary floating polysilicon layer; forming a control polysilicon layer on the ONO film; forming a hard mask layer pattern on the control polysilicon layer; forming a control gate by patterning the control polysilicon layer using the hard mask layer pattern as an etch mask; forming an auxiliary ONO pattern by patterning the ONO film; and forming a floating gate by patterning the auxiliary floating polysilicon layer using an etching material with an etching selectivity such that the etching material does not etch the ONO film.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
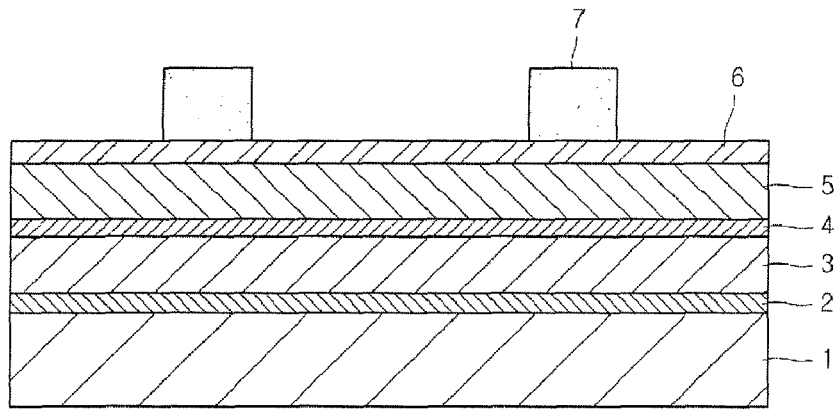
FIGS. 1 to 4 are cross-sectional views showing a related art stack-type flash device formed using a hard mask.
Figure 2:
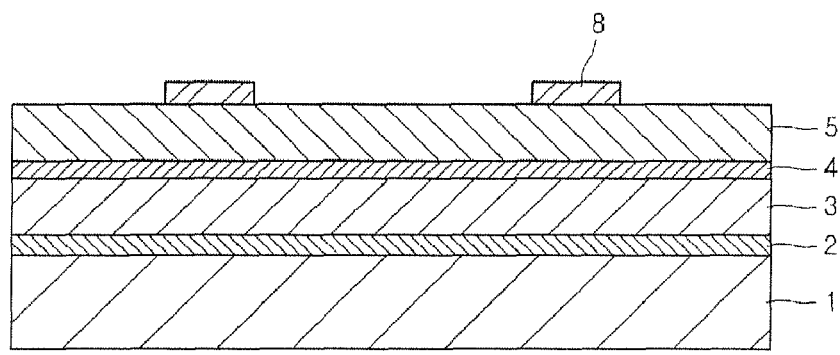
Figure 3:
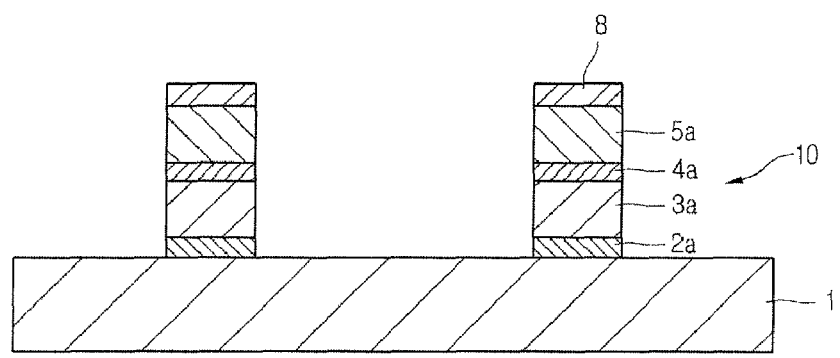
Figure 4:
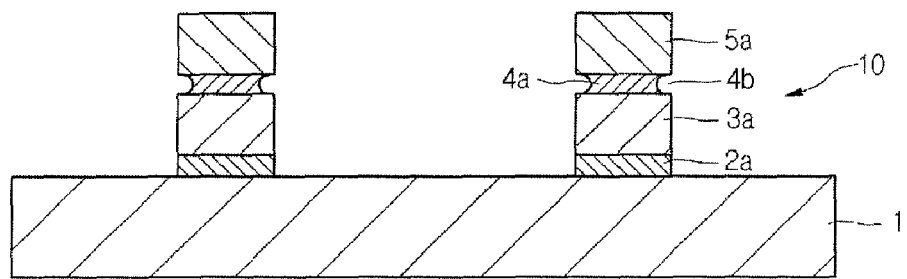
Figure 5:
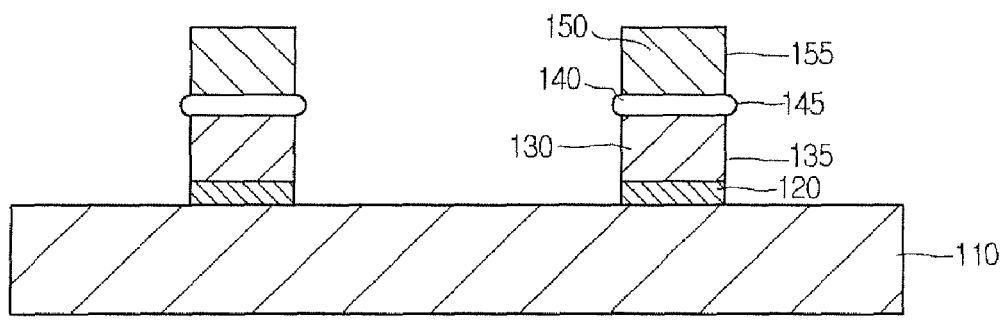
FIG. 5 is a cross-sectional view showing a flash device according to an embodiment of the present invention.

FIG. 5 is a cross-sectional view showing a flash device according to an embodiment of the present invention.

Referring to FIG. 5, a tunnel oxide film pattern 120 can be disposed on a semiconductor substrate. A floating gate 130 can be disposed on the tunnel oxide film pattern 120.

An oxide-nitride-oxide (ONO) pattern 140 can be provided on the floating gate 130.

A control gate 150 can be disposed on the ONO pattern 140.

The ONO pattern 140 can include a triple layer structure of a first oxide film, a nitride film, and a second oxide film. The ONO layer 140 can have a side 145 that projects out farther than the side 135 of the floating gate 130 and the side 155 of the control gate 150.

FIGS. 6 to 11 are cross-sectional views showing a method of manufacturing a flash device according to an embodiment of the present invention.

Figure 6:
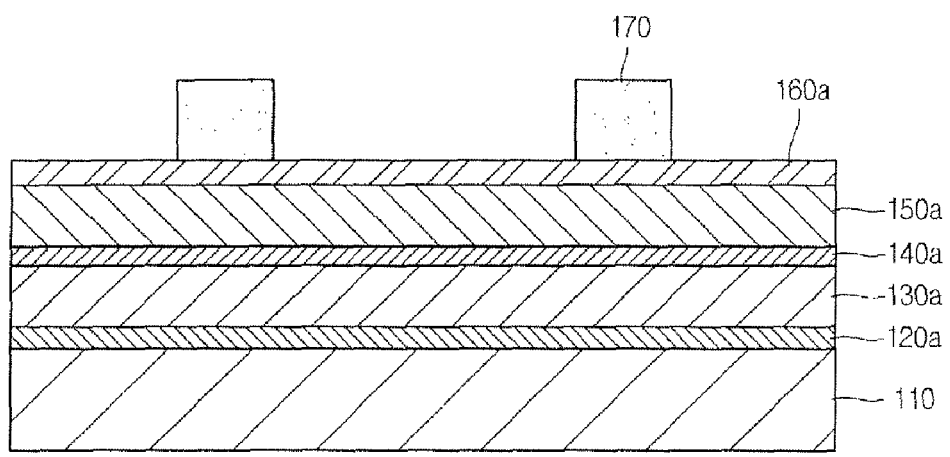
FIGS. 6 to 11 are cross-sectional views showing a manufacturing method of a flash device according to an embodiment of the present invention.

Referring to FIG. 6, a device isolating pattern (not shown) can be formed on a semiconductor substrate 110. A tunnel oxide film 120a can also be formed on the semiconductor substrate 110.

An auxiliary floating gate layer 130a can be formed on the tunnel oxide film 120a. In an embodiment, the auxiliary floating gate layer 130a can be formed of polysilicon.

An ONO film 140a can be formed on the auxiliary floating gate pattern 130a. The ONO film 140a can have a triple layer structure of a first oxide layer, a first nitride layer, and a second oxide layer.

A polysilicon layer 150a to be used as a control gate can be formed on the ONO film 140a.

Then, a hard mask layer 160a can be formed on the polysilicon layer 150a. The hard mask layer 160a can be, for example, an oxide, a nitride, or both.

A photoresist film (not shown) can be arranged on the hard mask layer 160a and then patterned to form a photoresist pattern 170 on the hard mask layer 160a. In an embodiment, the photoresist film and the photoresist pattern can be suitable for an argon fluoride (ArF) light source.

The hard mask layer 160a can be formed under an ArF photoresist pattern 170 since the ArF photoresist pattern 170 typically has a thinner coating thickness than that of a krypton fluoride (KrF) photoresist pattern. Accordingly, the hard mask layer 160a can be formed on the polysilicon layer 150a by the lack thickness of the ArF photo resist pattern 170.

Figure 7:
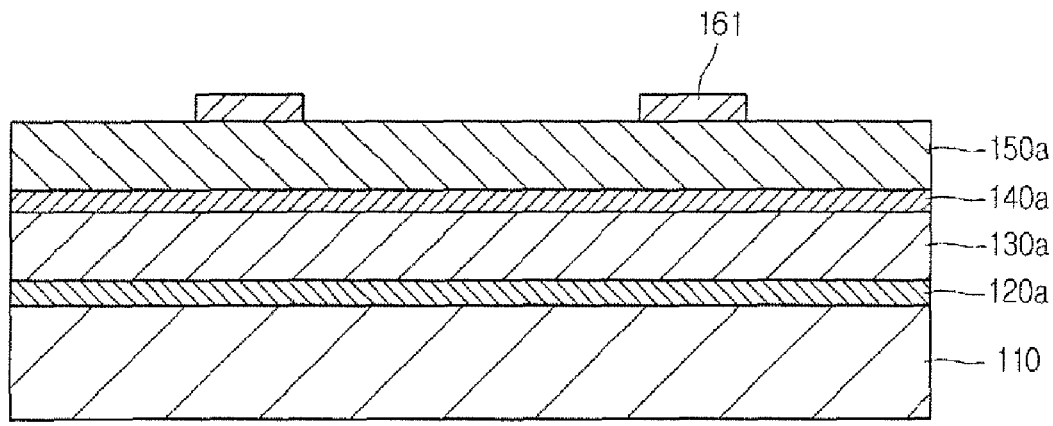

Referring to FIG. 7, the hard mask layer 160a can be patterned using the photoresist pattern 170 as an etch mask to form a hard mask pattern 161 on the polysilicon layer 150a to be used as a control gate. The photoresist pattern 170 can then be removed.

Figure 8:
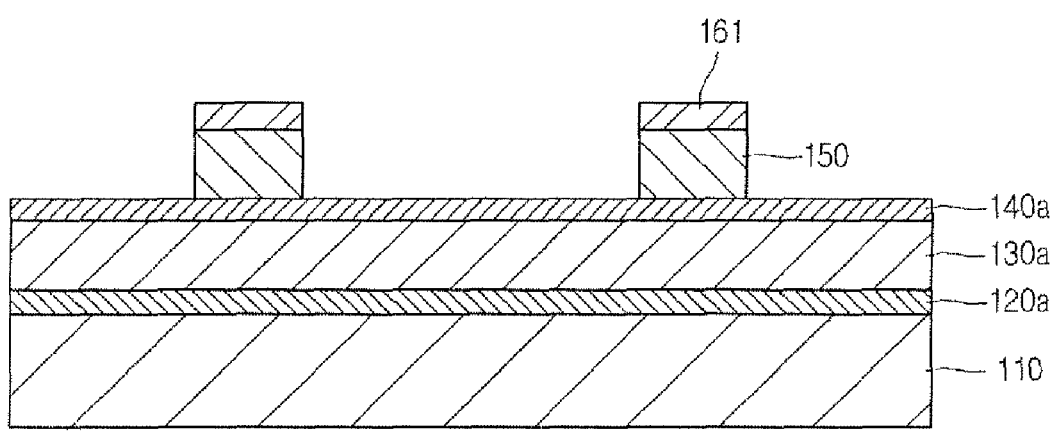

Referring to FIG. 8, the polysilicon layer 150a can be patterned using the hard mask pattern 161 as an etch mask to form a control gate 150 on the ONO film 140a.

In an embodiment, the etching conditions for etching the polysilicon layer 150a can include a pressure of about 3 mTorr to about 10 mT, a source power of about 500 W to about 650 W, a bias power of about 50 W to about 70 W, chlorine ($Cl_2$) gas provided at a rate of about 45 standard cubic centimeters per minute (sccm) to about 50 sccm, hydrogen bromide (HBr) gas provided at a rate of about 130 sccm to about 170 sccm, and helium/oxygen gas provided at a rate of about 10 sccm to about 15 sccm.

In an embodiment, when forming the control gate 150, an over etch process can be performed to remove the polysilicon layer 150a not in the control gate from the ONO film 140a. The over etch process conditions can include a pressure of about 70 mTorr, a source power of about 450 W, a bias power of about 80 W, HBr gas provided at a rate of about 300 sccm, helium (He) gas provided at a rate of about 200 sccm, and helium/oxygen gas provided at a rate of about 20 sccm.

Figure 9:
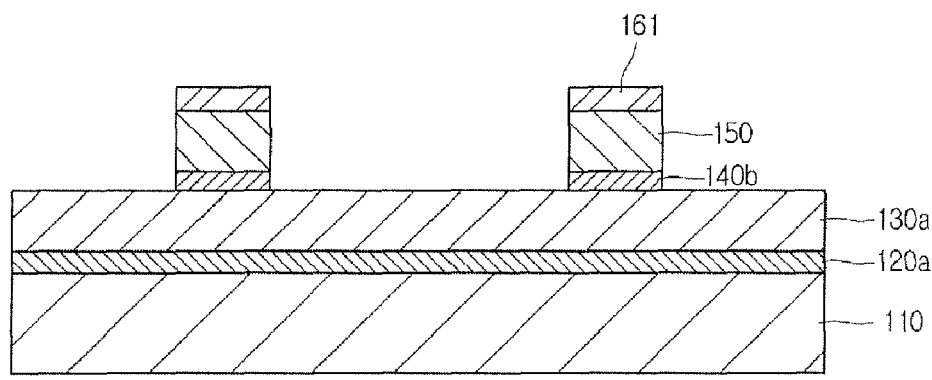

Referring to FIG. 9, after forming the control gate 150, the ONO film 140a can be patterned to form an auxiliary ONO pattern 140b.

In an embodiment, the etching conditions for etching the ONO film 140a can include a pressure of about 5 mTorr, a source power of about 300 W, a bias power of about 100 W, $CHF_3$ gas provided at a rate of about 100 sccm, and argon gas provided at a rate of about 100 sccm.

Figure 10:
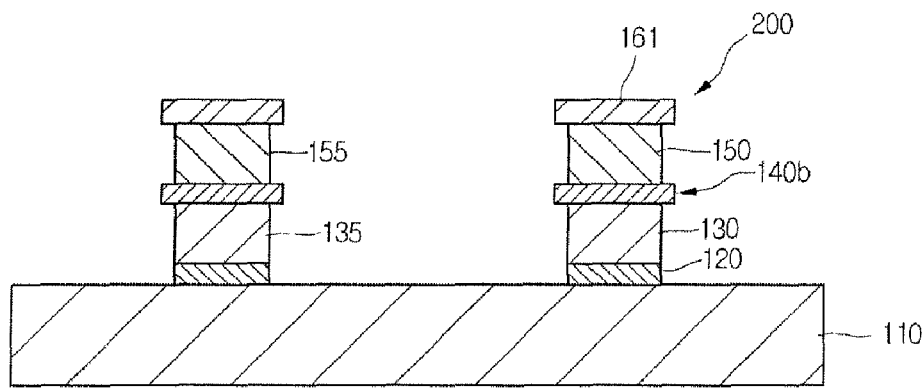

Referring to FIG. 10, after forming the auxiliary ONO pattern 140b, the auxiliary floating gate layer 130a can be patterned to form a floating gate 130. In an embodiment, when patterning the auxiliary floating gate layer 130a, the process conditions can include a pressure of about 15 mTorr, a source power of about 350 W, a bias power of about 40 W, HBr gas provided at a rate of about 150 sccm, and helium/oxygen gas provided at a rate of about 12 sccm.

In an embodiment, when patterning the auxiliary floating gate layer 130a to form the floating gate 130, the etchant can be chosen to have an etching selectivity such that the auxiliary ONO pattern 140b is not etched while the control gate 150 and the auxiliary floating gate layer 130a are etched. Accordingly, the side 145 of the auxiliary ONO pattern 140b can project farther than the side 155 of the control gate 150 and the side 135 of floating gate 130. Then, an over etching process can be performed on the auxiliary ONO pattern 140b. In an embodiment, when performing the over etching process, the process conditions can include a pressure of about 70 mTorr, a source power of about 400 W, a bias power of about 90 W, HBr gas provided at a rate of about 150 sccm, He gas provided at a rate of about 100 sccm, and helium/oxygen gas provided at a rate of about 10 sccm.

Figure 11:
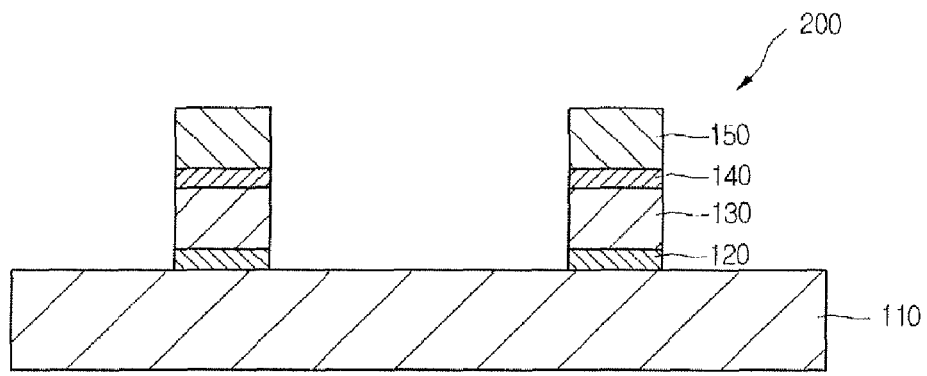

Referring to FIG. 11, the hard mask pattern 161 can be removed from the flash device 200.

In an embodiment, the hard mask pattern 161 can be removed through a wet etching process, for example, a vapor phase chromatography (VPC) process. The portions of the auxiliary ONO pattern that project farther than the control gate 150 and the floating gate 130 can be patterned to their final width such that they no longer project out farther than the control gate 150 and the floating gate 130 during removal of the hard mask pattern 161. In this way, the ONO pattern can be formed without being damaged.

In certain embodiments of the present invention, the ONO film of the flash device can be patterned to its final width after patterning the floating gate 130 to inhibit the ONO film of the flash device from being damaged.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a flash memory device, comprising:
    forming a tunnel oxide film on a semiconductor substrate;
    forming an auxiliary floating polysilicon layer on the tunnel oxide film;
    forming an ONO film on the auxiliary floating polysilicon layer;
    forming a control polysilicon layer on the ONO film;
    forming a hard mask layer comprising an oxide, a nitride, or both on the control polysilicon layer;
    patterning the hard mask layer to form a hard mask layer pattern on the control polysilicon layer;
    forming a control gate by patterning the control polysilicon layer using the hard mask layer pattern as a etch mask;
    forming an auxiliary ONO pattern by patterning the ONO film;
    forming a floating gate by patterning the auxiliary floating polysilicon layer using an etchant with a high etching selectivity to polysilicon, wherein the auxiliary ONO pattern is provided with a portion that projects out farther than a side of the control gate; and removing the hard mask layer pattern, wherein during removal of the hard mask layer pattern, the portion of the auxiliary ONO pattern that projects out farther than a side of the control gate is removed to form an ONO pattern.

2. The method according to claim 1, wherein forming the control gate comprises performing an etching process, and wherein process conditions of the etching process comprise:
   a pressure of about 3 mTorr to about 10 mTorr;
   a source power of about 500 W to about 650 W;
   a bias power of about 50 W to about 70 W;
   chlorine ($Cl_2$) gas provided at a rate of about 45 sccm to about 50 sccm;
   HBr gas provided at a rate of about 130 sccm to about 170 sccm; and
   helium/oxygen gas provided at a rate of about 10 sccm to about 15 sccm.

3. The method according to claim 1, further comprising performing an over etch process to remove portions of the control polysilicon layer not to be used as the control gate, wherein the over etch process is performed after forming the control gate.

4. The method according to claim 3, wherein process conditions of the over etch process comprise:
   a pressure of about 60 mTorr to about 70 mTorr;
   a source power of about 400 W to about 450 W;
   a bias power of about 60 W to about 80 W;
   HBr gas provided at a rate of about 200 sccm to about 300 sccm;
   helium gas provided at a rate of about 100 sccm to about 200 sccm; and
   helium/oxygen gas provided at a rate of about 15 sccm to about 20 sccm.

5. The method according to claim 1, wherein forming the auxiliary ONO film comprises performing a firs etching process, and wherein process conditions of the first etching process comprise:
   a pressure of about 5 mTorr;
   a source power of about 300 W;
   a bias power of about 100 W;
   $CHF_3$ gas provided at a rate of about 100 sccm; and
   argon gas provided at a rate of about 100 sccm.

6. The method according to claim 1, wherein forming the floating gate comprises performing an etching process, and wherein process conditions of the etching process comprise:
   a pressure of about 15 mTorr;
   a source power of about 350 W;
   a bias power of about 40 W;
   HBr gas provided at a rate of about 150 sccm; and
   helium/oxygen gas of provided at a rate of about 12 sccm.

7. The method according to claim 1, wherein forming the hard mask layer pattern comprises:
   forming a hard mask layer on the control polysilicon layer;
   forming a photoresist film on the hard mask layer;
   forming a photoresist pattern on the hard mask layer by patterning the photoresist film; and
   patterning the hard mask layer using the photoresist pattern as an etch mask.

8. The method according to claim 7, wherein the photoresist film comprises a photoresist material suitable for an argon fluoride (ArF) light source.

9. The method according to claim 1, wherein removing the hard mask layer pattern comprises performing a wet etching process.

10. The method according to claim 9, wherein the wet etching process is a vapor phase chromatography process.

* * * * *